United States Patent
Blum

(10) Patent No.: US 9,170,032 B2
(45) Date of Patent: Oct. 27, 2015

(54) HELIOSTAT TRACKING AND OPERATION FOR A SOLAR POWER GENERATION PLANT

(71) Applicant: Michael Gerard Blum, Palo Alto, CA (US)

(72) Inventor: Michael Gerard Blum, Palo Alto, CA (US)

( * ) Notice: Subject to any disclaimer, the term of this patent is extended or adjusted under 35 U.S.C. 154(b) by 275 days.

(21) Appl. No.: 13/673,900

(22) Filed: Nov. 9, 2012

(65) Prior Publication Data

US 2013/0306057 A1 Nov. 21, 2013

Related U.S. Application Data

(60) Provisional application No. 61/557,863, filed on Nov. 9, 2011.

(51) Int. Cl.
| | | |
|---|---|---|
| *F24J 2/38* | (2014.01) | |
| *F24J 2/40* | (2006.01) | |
| *F24J 2/07* | (2006.01) | |
| *F24J 2/10* | (2006.01) | |
| *H01L 31/052* | (2014.01) | |
| *H01L 31/042* | (2014.01) | |
| *H01L 31/054* | (2014.01) | |

(52) U.S. Cl.
CPC .... *F24J 2/38* (2013.01); *F24J 2/07* (2013.01); *F24J 2/10* (2013.01); *F24J 2/40* (2013.01); *F24J 2/407* (2013.01); *H01L 31/0525* (2013.01); *H01L 31/0547* (2014.12); *H02S 20/00* (2013.01); *F24J 2002/385* (2013.01); *Y02E 10/41* (2013.01); *Y02E 10/47* (2013.01); *Y02E 10/52* (2013.01)

(58) Field of Classification Search
CPC ............ H01L 31/0525; F24J 2/07; F24J 2/10; F24J 2002/385; F24J 2/38; G02B 7/183
See application file for complete search history.

(56) References Cited

FOREIGN PATENT DOCUMENTS

WO    WO 2009152573 A1 * 12/2009 .............. Y02E 10/40

* cited by examiner

*Primary Examiner* — Francis M Legasse, Jr.
(74) *Attorney, Agent, or Firm* — David R. Stevens; Stevens Law Group

(57) ABSTRACT

A method and system is provided whereby heliostats in a solar power plant may be calibrated without being aimed away from the receiver. The heliostats may be moved through a calibration path different from their operational path. The calibration path may start from any point along the operational path of the heliostat and may move the reflected sunlight from the heliostat across a portion of the solar receiver. Individual power generation receiver modules may be monitored to detect changes in output as the calibration path takes the heliostat reflection across various receiver modules.

15 Claims, 12 Drawing Sheets

RECEIVER MODULES MOUNTED ON RAILS

VIEW OF PARTIALLY LIFTED RECEIVER MODULE LINE WITH OPTIONAL RETAINER/SHIELDS SHOWN

RAIL BEING PIVOTED FOR SERVICE

RAIL TO MODULE ATTACH

2 EXAMPLES OF OPTICS RETAINING CLIPS

HELIOSTAT TRACKING AND OPERATION FOR A SOLAR POWER GENERATION PLANT

FIELD OF THE INVENTION

This invention relates to solar power generation plants and more particularly to methods for controlling and operating solar power plant heliostats.

BACKGROUND OF THE INVENTION

Difficulty arises in controlling and operating heliostats for solar power plants. Particularly, it can be difficult to keep a heliostat properly tracking the sun so that the reflected light falls properly on a solar receiver. This often requires expensive drive/tracking motors for the heliostats to minimize errors in heliostat position and burdensome methods to calibrate and verify the tracking of the heliostats. Accordingly, what is needed is a system and method for easily calibrating and correcting the position of the heliostats and thereby facilitating use of less expensive components in the heliostat drive assemblies. As will be seen, the invention provides such an approach in an elegant manner.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the embodiments, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods. Accordingly, a novel approach is provided for verifying the position of a heliostat or a group of heliostats in a solar power generation system and for correcting the position of those heliostats if necessary.

Figure 1:
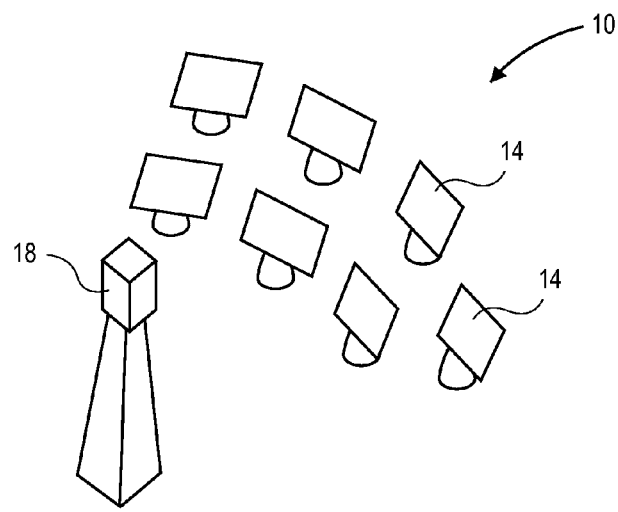
FIG. 1 is a schematic diagram of one embodiment of a solar power system having the capability to easily verify the position of individual heliostats or groups of heliostats and thereby ensure proper tracking.
Figure 2:
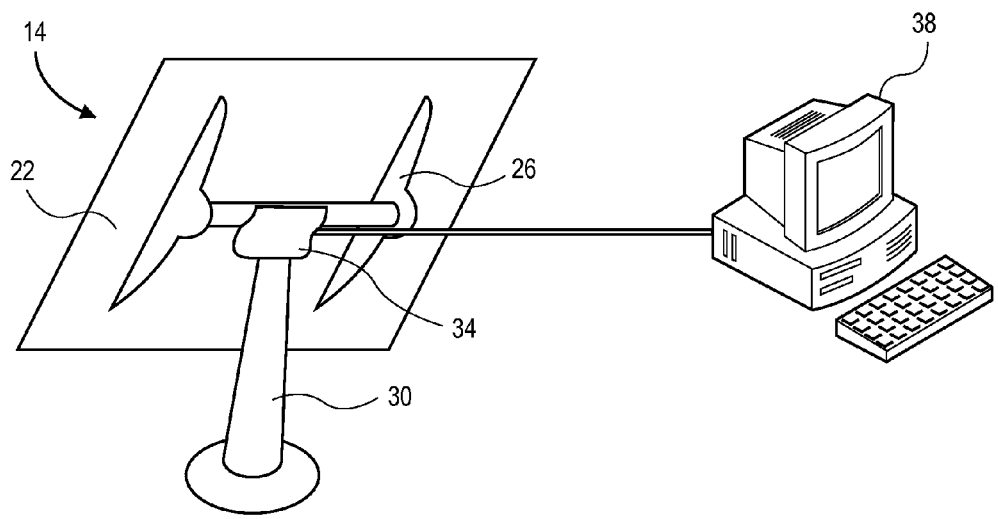
FIG. 2 is a schematic diagram of a single heliostat.

Referring now to FIG. 1, a solar power generation system is shown. The system 10 includes a plurality of heliostats 14 and a solar receiver 18. As shown in FIG. 2, each heliostat 14 may be engineered differently, but typically includes a mirror or system of mirrors 22, a support frame 26 which holds the mirror 22, a base 30 which is anchored to the ground, and a drive assembly 34 which moves the support frame 26 and mirrors 22 relative to the base 30 to control the position of reflected light from the heliostat. The drive assembly 34 is typically connected to a control computer 36 by a network, control cable, etc. The computer 36 provides instructions to the drive assembly 34 to position the heliostat 14. Each of the heliostats 14 are typically operated to reflect sunlight onto the solar receiver 18 to thereby produce power.

The solar receiver 18 receives the sunlight from the heliostats 14 to produce power therefrom. The solar receiver 18 may include a thermal receiver or may include a photo voltaic receiver. Thermal receivers are often used to accept sunlight from the heliostats and generate high temperature fluid. This high temperature fluid may be used to generate electricity, such as by powering a turbine. In many cases, the high temperature fluid is used to create steam in a heat exchanger and the steam is used to generate electricity, such as through a turbine.

Figure 3:
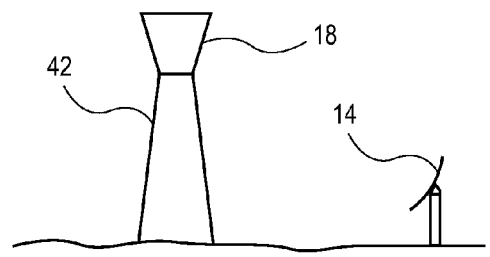
FIG. 3 is a schematic diagram of a heliostat and receiver.

FIG. 3 shows an exemplary solar receiver 18. The solar receiver 18 is typically mounted on top of a receiver tower 42. The solar receiver 18 and heliostats 14 may be positioned such that light is reflected upwardly towards the solar receiver. As such, the solar receiver 18 is often angled downwardly towards the heliostats. The position of the solar receiver 18 on a tower 42 and its orientation angled downwardly towards the ground make installation and maintenance of the solar receiver 18 difficult.

Figure 4:
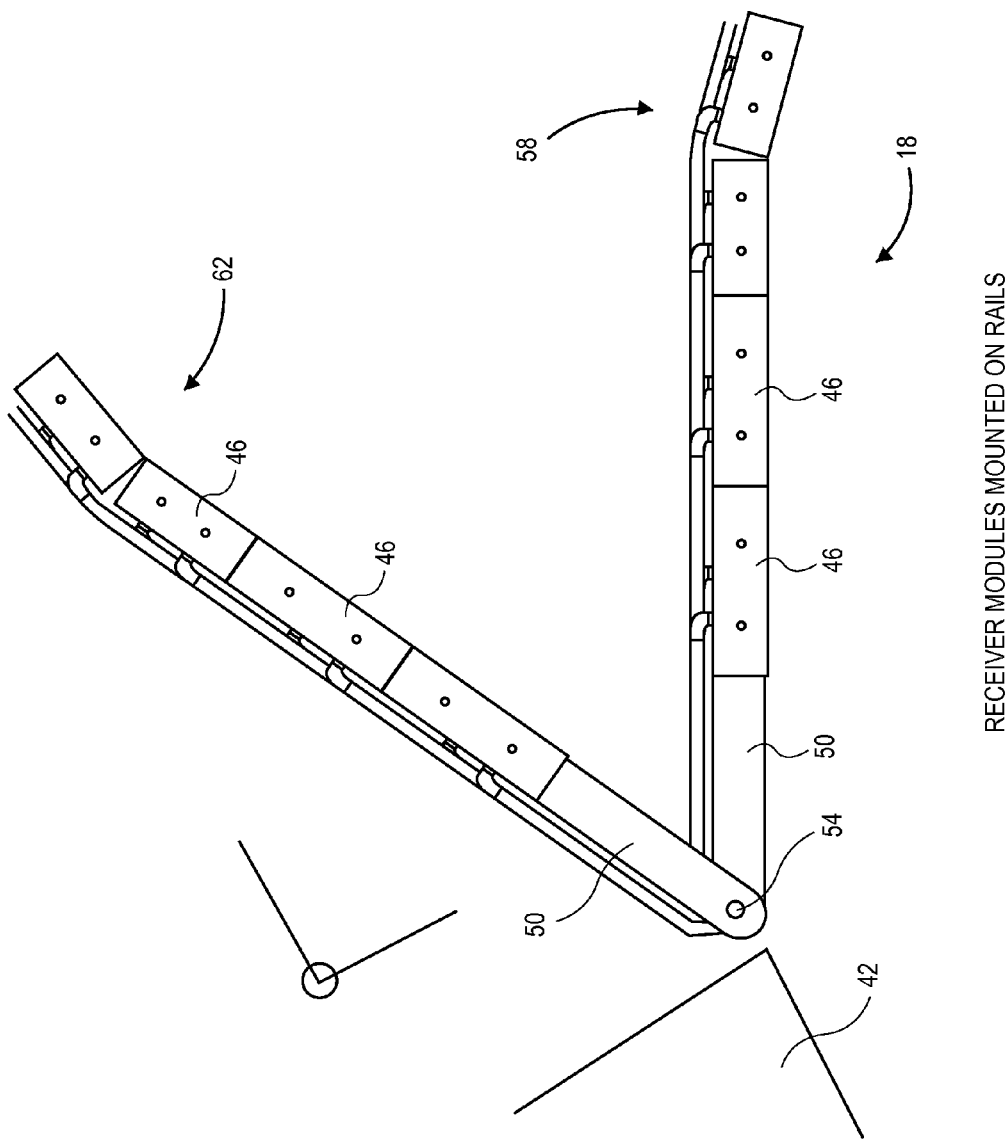
FIG. 4 is a schematic diagram of a portion of the receiver.

The receiver 18 may be constructed of a plurality of smaller individual receiver modules. The receiver modules may be arranged in an array, having multiple columns of receiver modules which each contain a number of receiver modules. The receiver modules may be mounted to individual carrier rails which allow a column of receiver modules to be pivoted backwards for servicing. FIG. 4 shows a representative side view of an assembled receiver 18. A plurality of receiver modules 46 are mounted to mounting rails 50. Each of the mounting rails 50 may include multiple rails acting together in a set. FIG. 4 illustrates two mounting rails 50, each having a plurality of receiver modules 46 which each form a column of receiver modules within a larger receiver 18.

Two mounting rails with one of its columns swung out for servicing or inspection. The mounting rails 50 are attached to the tower 42 at pivot 54. The mounting rails 50 can swing between an operational position 58 and a service position 62. In the operational position 58, the receiver modules 46 are typically pivoted outwardly from the tower 42 and angled towards the ground so as to be in better alignment with the heliostats. In this position the receiver modules are difficult to service. In the service position 62, the receiver modules are pivoted back into the tower 42 where they may be much more easily service. Swinging a single rail 50 moves a single column of receiver modules 46 back into the tower 42 allowing good access around the receiver modules. In this example, the mounting rails 50, and thus the columns of receiver modules 46, are slightly bent to provide a concave receiver design.

Figure 5:
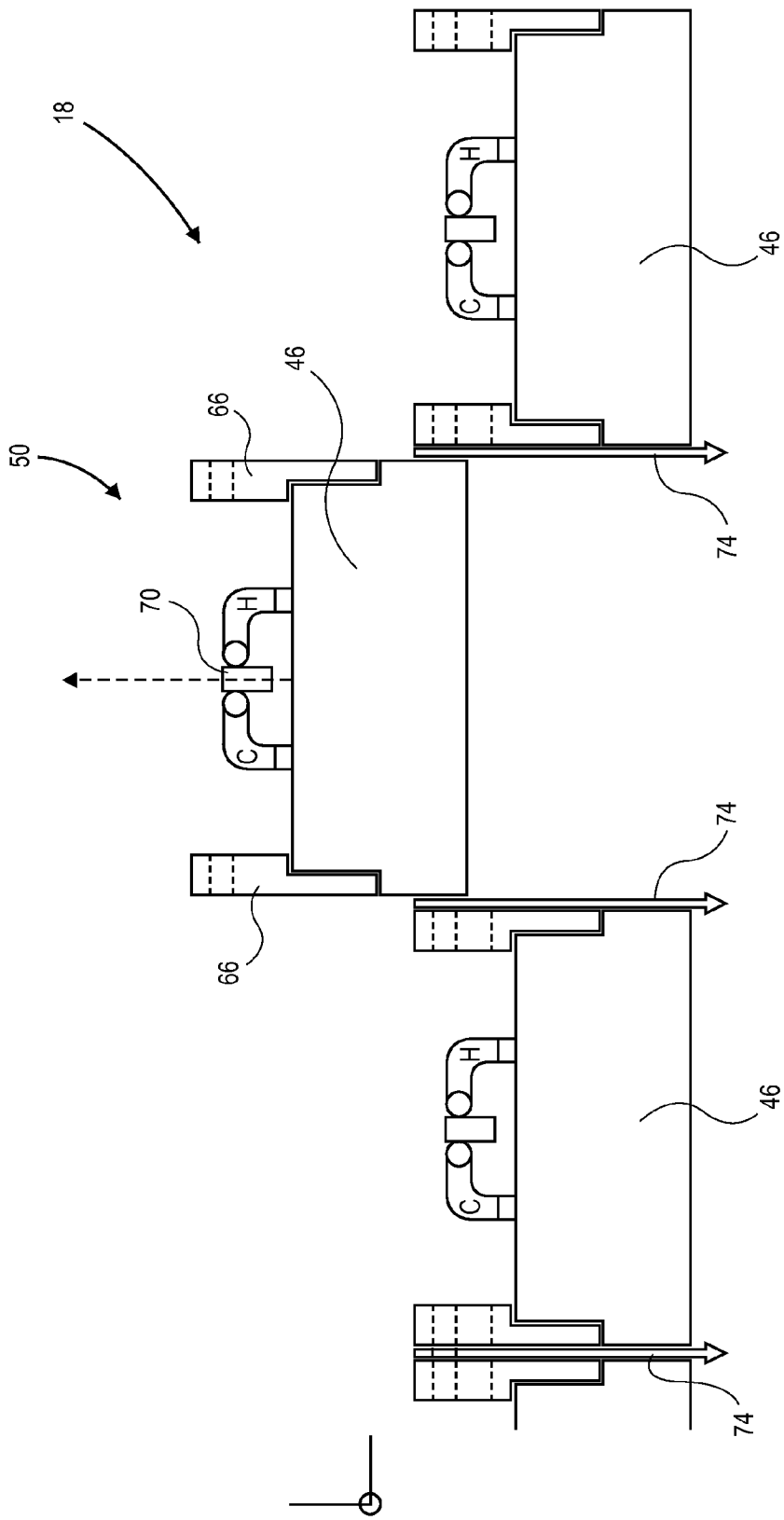
FIG. 5 is a schematic diagram of a portion of the receiver.

FIG. 5 shows an exemplary view through the through the receiver 18, illustrating how a rail 50 and column of receiver modules 46 can be lifted and pivoted backwards into the tower 42. This brings the rail 50 and its contents out of the receiver 18 while leaving its neighbors undisturbed. The mounting rail 50 includes two side rails 66 and a back rail 70. The side rails 66 may be used primarily for mounting and supporting the receiver modules 46. The back rail 70 may be used for supporting the receiver modules 46 and also for supporting cooling fluid pipes, etc. The receiver 18 also includes retaining shields 74. The retainer shields are mounted at the bottom of the receiver 18 (adjacent the pivot 54) and the top of the receiver adjacent the upper ends of the receiver modules and rails. The retainer shields 74 can remain in place while any rail 50 and associated column of receiver modules 46 is pivoted back for service.

The retainer shields 74 are generally arrow shaped and include a tapered head which forms lateral shoulders or ledges. The receiver modules 46 can rest against the retainer shield shoulders for support. The tapered head of the retainer shields 74 can reflect incoming light so that the light is directed towards the receiver modules.

Figure 6:
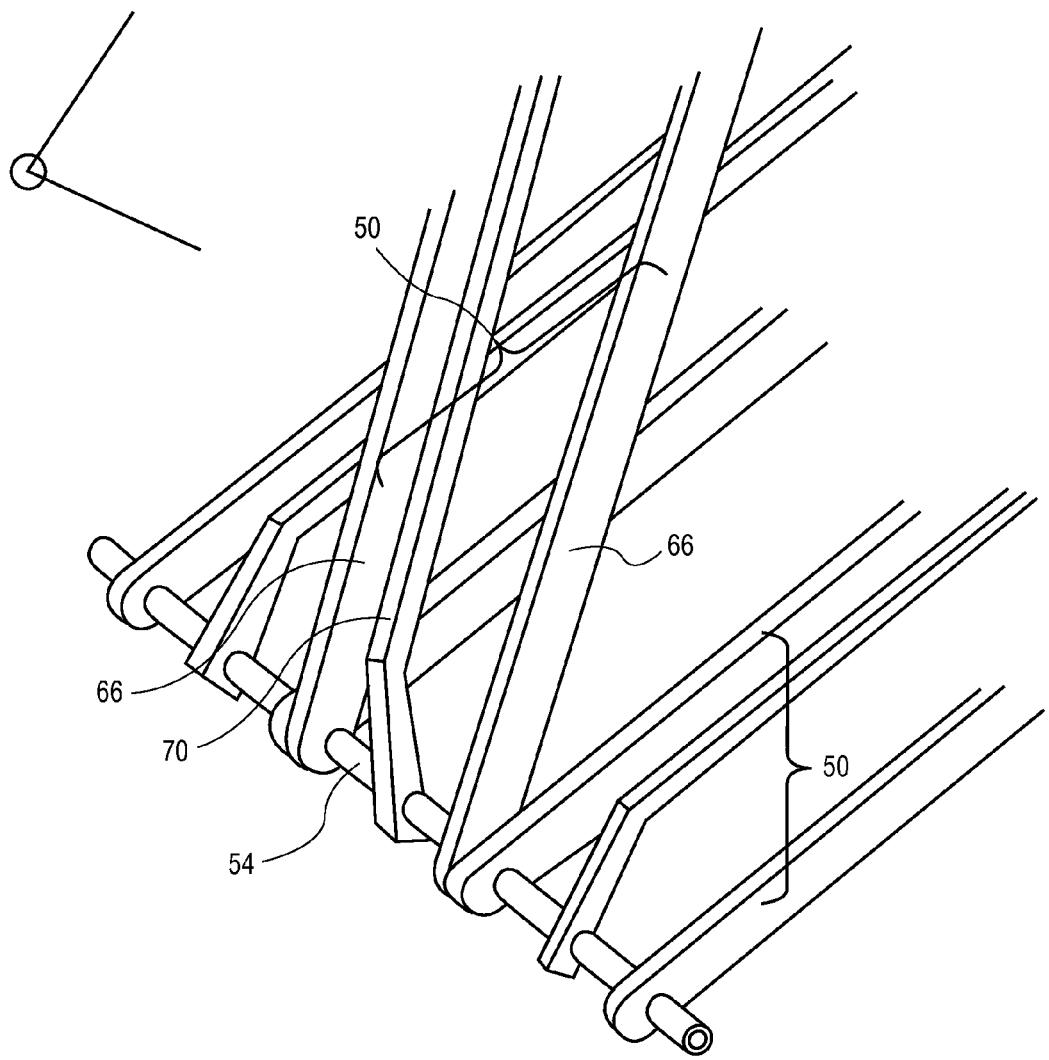
FIG. 6 is a schematic diagram of a portion of the receiver.

FIG. 6 shows three rails 50. Each rail includes a pair of side rails 66 and a back rail 70. One rail 50 has been pivoted backwards from the other rails similar to that shown in FIG. 5.

Figure 7:
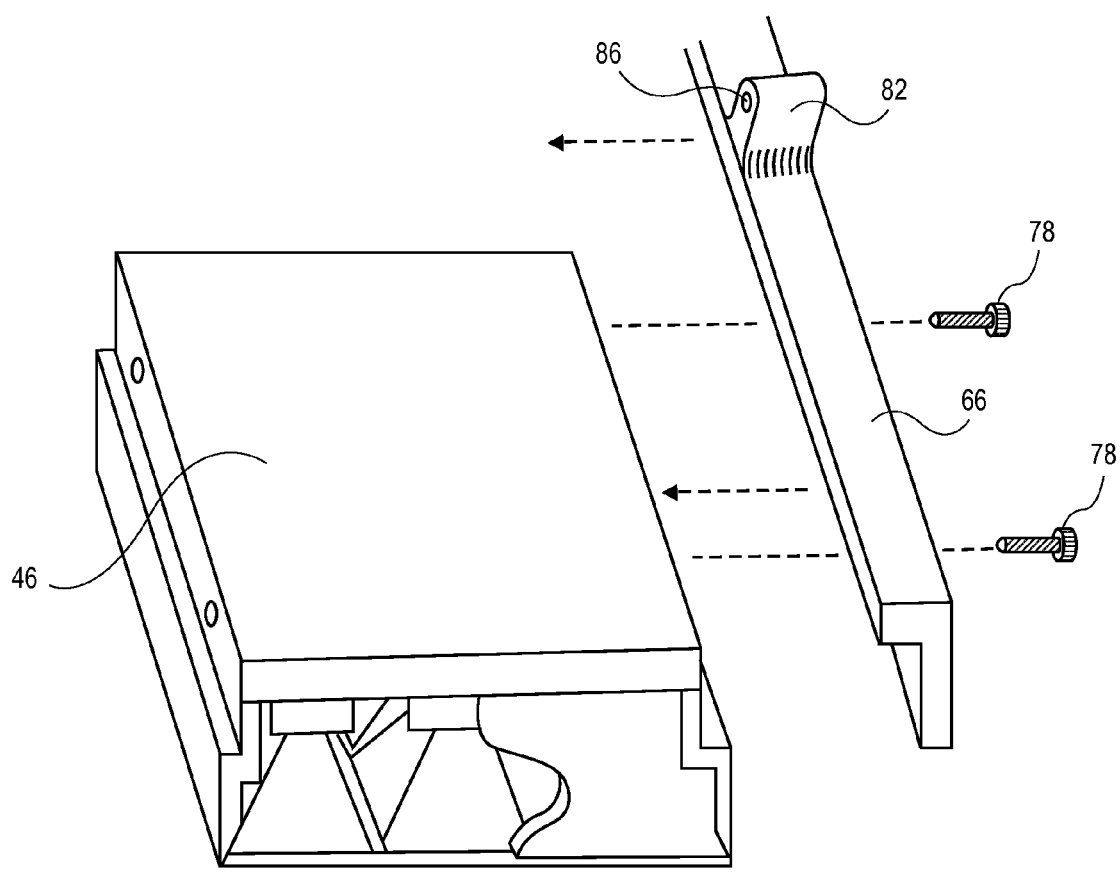
FIG. 7 is a schematic diagram of a portion of the receiver.

FIG. 7 shows an example of how a receiver module can be attached to a side rail 66 using lateral fasteners 78 such as machine screws. The side rail 66 is also shown with a tab 82 with a through hole 86. The tab 82 and hole 86 may be used to attach a removable beam to the back of a number of adjacent rails for further support and stiffness when the receiver 18 is operating. The receiver modules 46 may be configured so that the side rails 66 attach to the back portion of the sides of the receiver modules, allowing the receiver modules in adjacent rails 50 to have minimum space between them. The receiver modules 46 may be thermal modules which heat a fluid to power a turbine or the like to thereby produce electricity. The receiver modules may also be photovoltaic cells which produce electricity.

Figure 8:
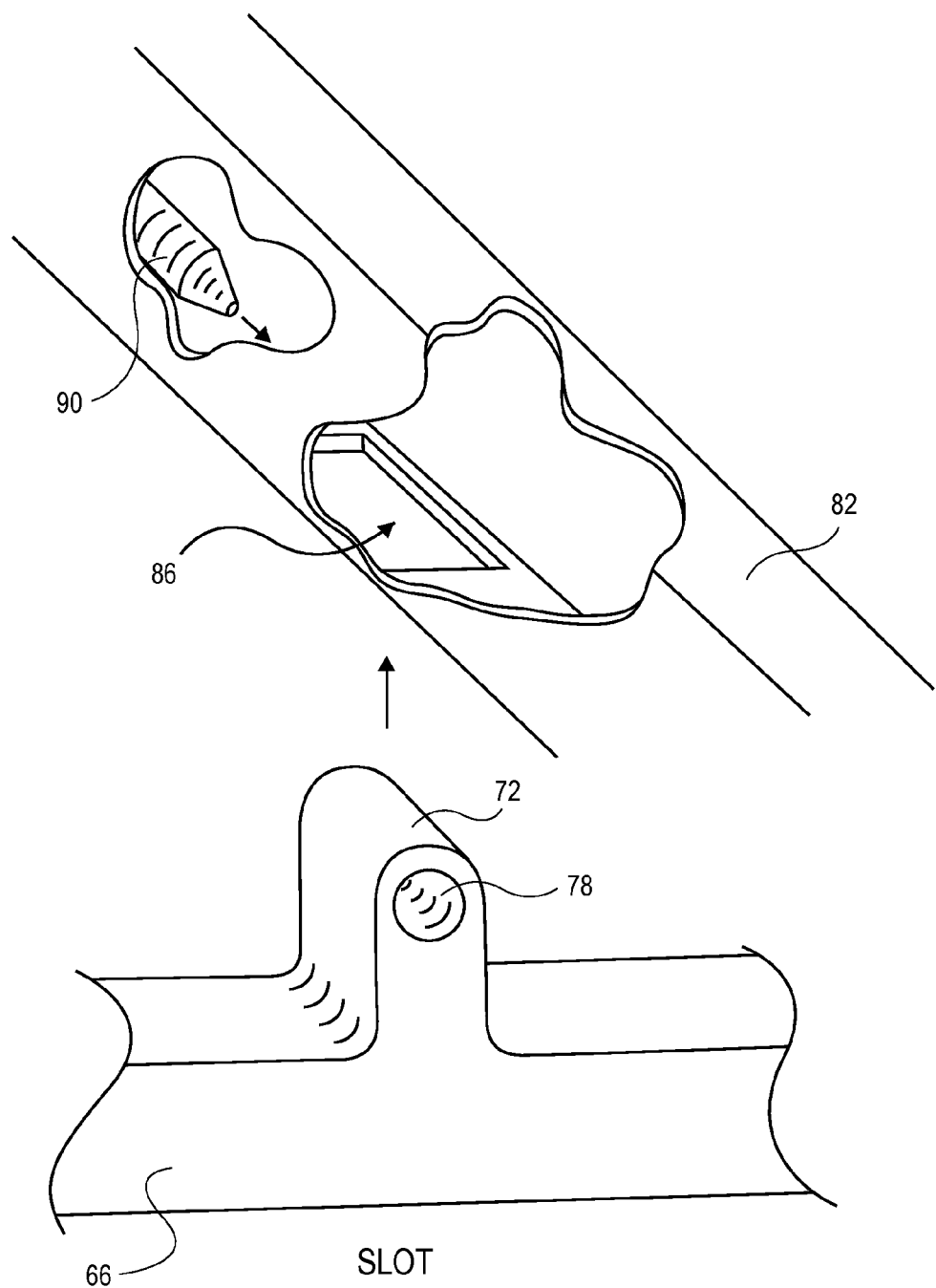
FIG. 8 is a schematic diagram of a portion of the receiver.
Figure 9:
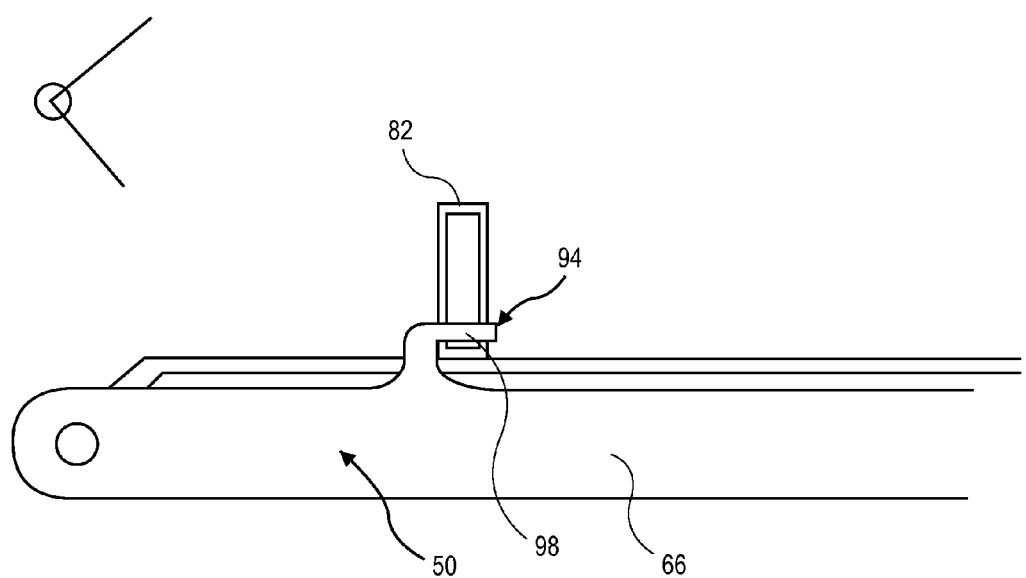
FIG. 9 is a schematic diagram of a portion of the receiver.

FIG. 8 shows a support beam 82 with an opening 86 in the underside thereof. The beam may be attached to the rails by passing the opening 86 over the tabs 72 and passing a rod through the beam 82 and through the holes 78. This allows the beam to be easily attached to the rails 50 and thereby provide increased stability to the receiver 18 by joining adjacent rails 50. The beam 82 is easily removed from the rails 50 to service the receiver 18. As shown in FIG. 9, the beam 82 may alternatively have holes 94 which are passed over hooks 98 formed on the rails 50, such as on the side rails 66.

Figure 10:
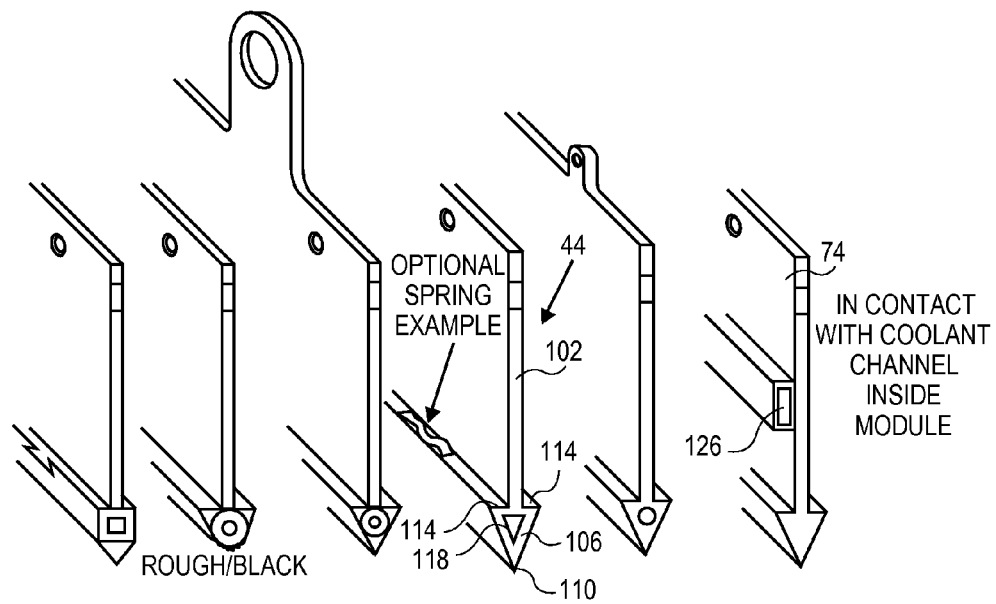
FIG. 10 is a schematic diagram of a portion of the receiver.
Figure 10:
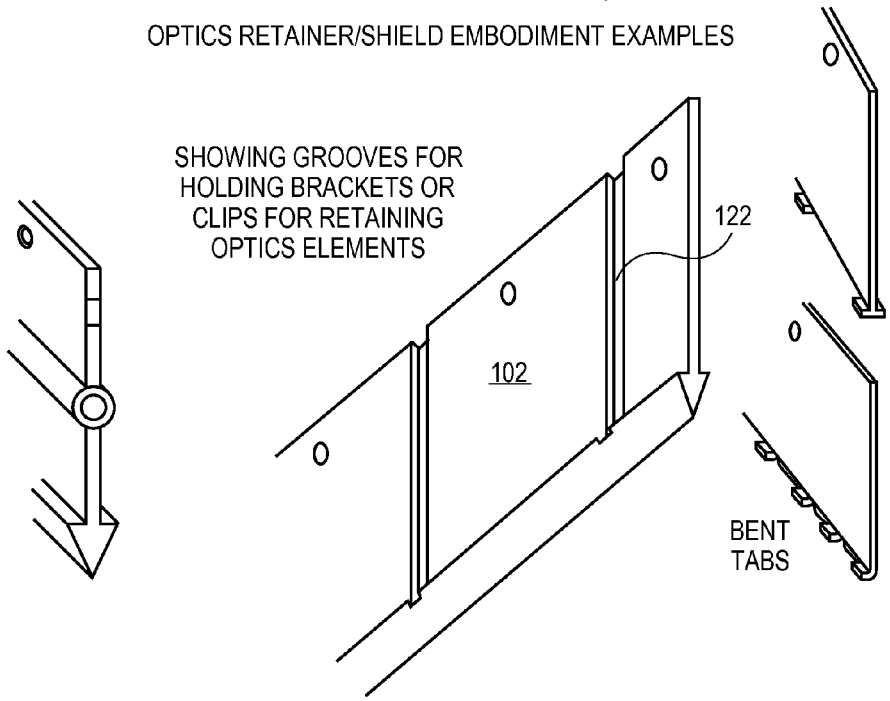

FIG. 10 shows several examples of support shields 74. The support shields 74 may be used between adjacent columns of receiver modules 46 for various reasons. Some receiver modules may require mechanical support. The support shields may also provide an additional measure of safety in the event that a receiver module breaks. The support shields 74 may also provide for the reduction of convective losses between receiver modules, compression to achieve a seal, or accommodate thermal expansion and other tolerances, etc.

The support shields 74 include an elongate and relatively narrow body portion 102. The support shield 74 may be formed with an arrow shaped cross section, providing a front portion 106 which includes a narrowed edge 110 and shoulders 114 which extend laterally from the body portion 102. The front portion 106 may also include a conduit 118 formed therethrough along the length of the support shield 74. The conduit 118 may be used to carry cooling fluid as the support shield is exposed to concentrated sunlight and may experience highly elevated temperatures. The cooling fluid may be used to provide power if desired. The front portion of the support shield may be reflective so that sunlight is directed towards the receiver modules 46. In this situation, the front portion 106 may be formed in an acute angle. Alternatively, the front portion 106 may absorb sunlight (increasing its usefulness in heating fluid). In this configuration, the shape is less important and the cooling capacity and reliability is more important.

If necessary, the body 102 of the support shield 74 may include slots 122 which accommodate brackets, clips, or other structures associated with the receiver modules 46. Additionally, the support shield 74 and receiver modules 46 may be designed such that the support shield is in contact with a coolant channel 126 associated with the receiver modules 46.

Figure 11:
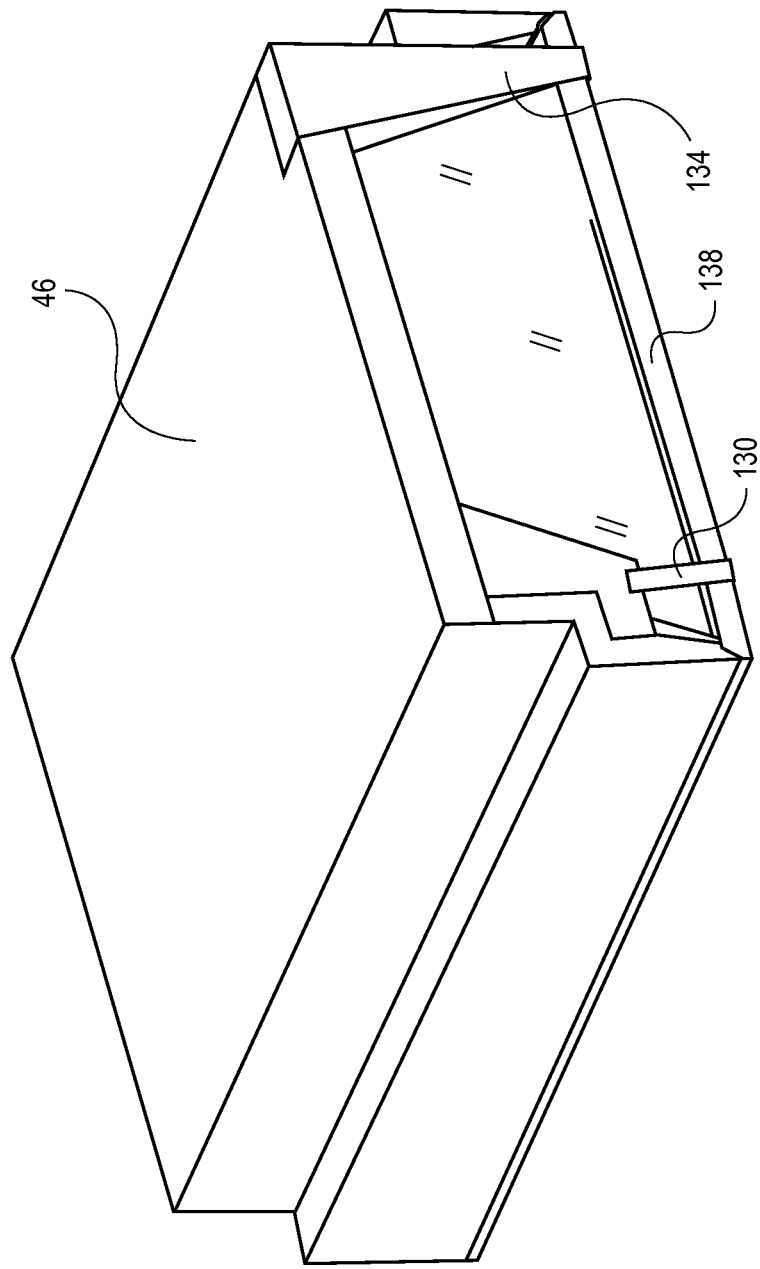
FIG. 11 is a schematic diagram of a receiver module.

FIG. 11 shows examples of a clip 130, 134 used to retain an optical element to the outer surface of a receiver module 46. The clips 130, 134 may be used to hold the parts of the receiver module together, allowing the receiver module to support itself adequately while being lifted free of the surrounding receiver modules 46 and rail 50. The clips 130, 134 are thin, eliminating thick side supports in order to increase the percentage of the receiver 18 surface area which is covered by receiver modules.

Figure 12:
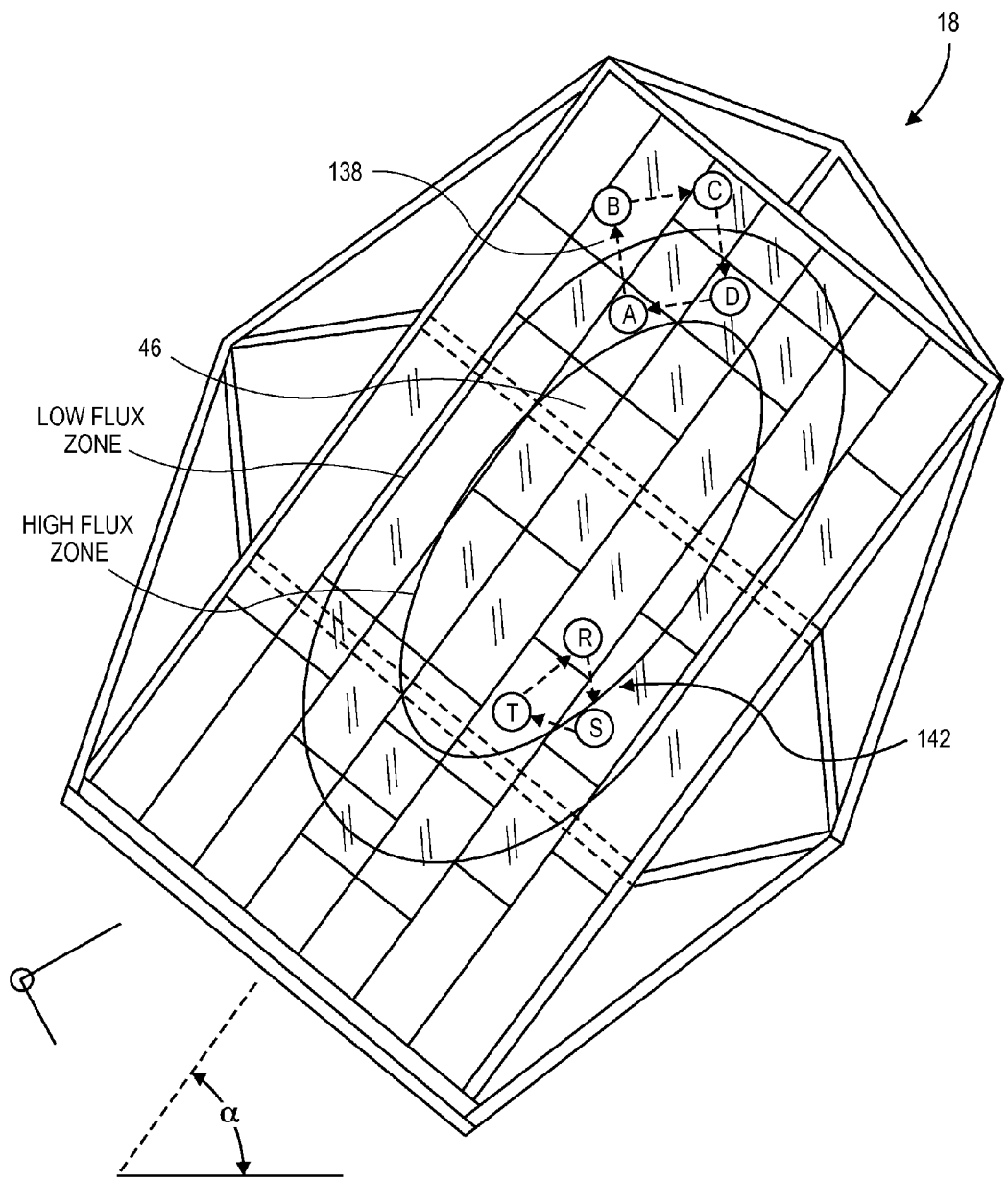
FIG. 12 is a schematic diagram of a receiver.

FIG. 12 shows an example receiver 18. The solar receiver 18 is typically constructed of a plurality of individual receiver modules 46. The individual receiver modules 46 are held together in columns by rails 50 as discussed, and are disposed in an array which forms the larger receiver 18. For simplicity, the rails and other structures discussed above are not shown.

The receiver array 18 itself may be used to manage the tracking and operation of the heliostats 14. This can be accomplished by measuring output of individual receiver modules 46 while one or more heliostats 14 are moved through paths which deviate from a normal operational path. As discussed herein, a 'path' often refers to the path of movement of one or more heliostats. A 'path' may also refer to the path or movement across the receiver 18 of the patch of sunlight which is reflected from the heliostat 14. It is appreciated that the movement of the reflected sunlight across the receiver 18 is caused by the movement of the heliostat 14.

The heliostats 14 are moved in order to position their reflected sunlight on the receiver 18 as the sun moves during the day. In some cases, the movement of a heliostat 14 may not cause movement of the reflected sunlight as the heliostat may be programmed to keep the sunlight reflection on a certain part of the receiver 18. In other cases, the heliostat 14 may be moved to move the sunlight across the receiver 18 in order to change the output of the power generation system or to calibrate the position of the heliostat.

Heliostat paths can be described by numerous waypoints and times, by interpolations, or by other equation forms. For simplicity, only a few simple motion paths are marked on the receiver 18. The paths are marked to show different points on the receiver 18 and to show the movement between these points.

The motion of the reflection center of one heliostat or cluster of heliostats, as it moves from A to B, crosses from one receiver module to another receiver module and generates a difference in output power in these receiver modules. For simplicity, the receiver modules are discussed as being photovoltaic modules. As the heliostat moves from A to B along path 138, the receiver module at A will experience reduced power generation and the receiver module at B will experience increased power generation. This may be detected, for photovoltaic modules, as increased or voltage or current. In calibrating the position of a heliostat, the heliostat may be moved through a path which moves between multiple destinations, such as between A, B, C, and D.

The measured output differences between these receiver modules can confirm to the computer 38 when the heliostat was aimed at these particular receiver modules, and the computer can correlate the confirmed positions (reflection on the particular receiver modules) to the expected position and, if different, adjust the calibration settings of the heliostat. If the calibration is thus verified, and/or more power is generated, the perturbation can be stopped, in effect adopting a new 'home position'. If results are not along those lines, the path can be continued and changed until the calibration is confirmed to the degree desired. In some embodiments, calibrating the heliostat from the detected changes in output of the individual receiver modules comprises adjusting the transit speed of the heliostat along the predetermined path. In some embodiments, the method further comprises operating the heliostat in an operational mode with reduced electrical power and wherein the step of calibrating the heliostat comprises adjusting the transit speed of the heliostat to compensate for inaccuracy associated with reduced electrical power.

The path indicated at 142, the R-S-T path, can be another example of a tuning experiment. At this time of day, with this power plant design, assume that the high-flux zone is shrinking in width. Assume further that the more expensive PV module at R is capable of higher marginal efficiency at current flux levels, than is module T and possibly S, which may be seeing increased cogeneration circulating fluid temperature rises. The command to perform the S-T-R path perturbation will then result in confirmation and correction of the calibration of the heliostat or cluster. If the output power was higher when pointed to T, the heliostat or cluster can be paused or backtracked to return to T. Later in the day, the heliostat may be commanded to traverse path T-R-S to address expected widening of the high-flux zone. In this manner, movement through a path expected to increase the operational capacity of the receiver 18 may provide calibration of the heliostat aiming (by detecting the increases and decreases of individual receiver module output associated with the path) and may also provide optimization of the power plant operation. While the path is intended to move the heliostat into a position which increases the overall power generation of the receiver 18, the actual overall power generation can be measured during the path movement and this can confirm the operational strategy.

Figure 13:
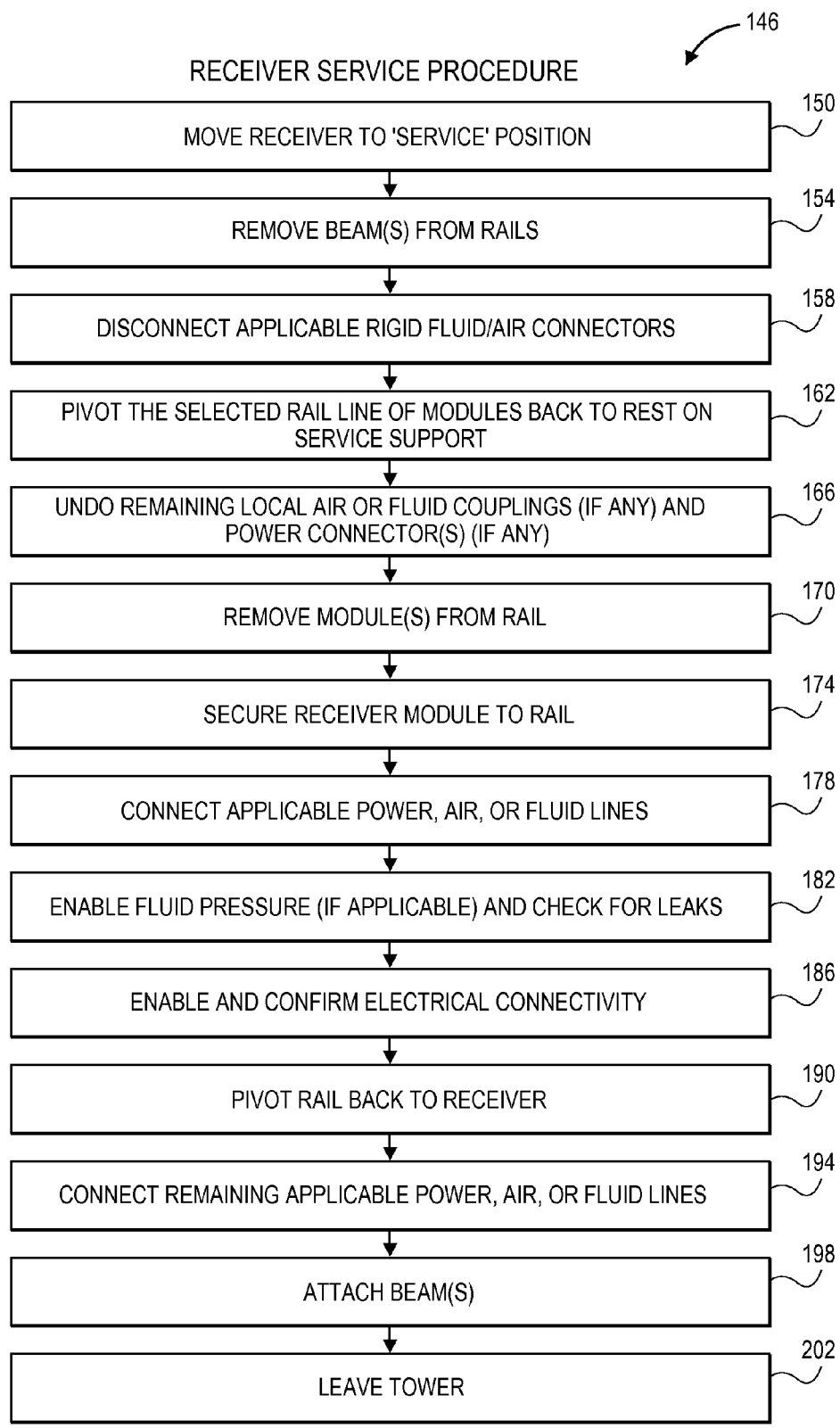
FIG. 13 illustrates a process for servicing the receiver.

FIG. 13 shows an exemplary process 146 which may be used to service receiver modules 46 in a receiver 18. From within the receiver tower 42, the person may first move a receiver frame to a service position 150 and then remove 154 any beams 82 from the rails 50. The person may then disconnect 158 fluid or air connections from a desired rail 50 if necessary. The person may then pivot 162 the desired rail 50 backwards into the tower 42 to access the receiver modules 46. If accessible, the person may then inspect or service a receiver module while attached to the rail 50. If necessary to remove a receiver module 46, the person may then disconnect 166 any remaining fluid or power connections and may remove 170 a desired receiver module 46 from the rail 50.

The receiver module 46 may then be repaired or replaced as necessary. The receiver module 46 may then be secured 174 to the rail 50 and the person may connect 178 any applicable fluid or power lines. The person may then enable 182 fluid pressure and check for leaks and enable 186 electrical connectivity. The rail 50 may then be pivoted 190 forwards into alignment with the receiver 18. If necessary, the person may then connect 194 any remaining fluid or power lines and verify proper assembly of the receiver. Beams 82 may be reattached 198 to the rails 50, and the person may leave the tower 42. As discussed, the rails 50 and support structures associated with the receiver 18 allow the person to service the receiver from inside of the tower.

In constructing and operating a power plant, it is often desirable to first gather information regarding select technology and business choices; heliostat field technology, receiver modules, infrastructure and cost elasticities, locale, weather databases, etc. It is often desirable to simulate to get matched receiver & heliostat field layout and suggested initial heliostat pointing patterns and groupings. This gives you simulated data on each heliostat's reflection pattern; the changes in current or voltage or power as it crosses the different PV sensors, the flux distribution & daily, seasonal variations, on the receiver, of each heliostat, each heliostat cluster, and the entire heliostat field.

The simulated data also provides an initial set of calculated pointing paths for each heliostat & cluster. By computer simulation, calculate sets of sensor reading changes resulting from the motion of each heliostats reflection across the photovoltaic receiver modules and possible additional photovoltaic sensors. (Some photovoltaic sensing can be done by less expensive photovoltaic cells designed for lower flux levels than those present across the receiver generally. A likely example would be a column or row of PV cells or sensors on the tower body, where the solar flux is rarely concentrated beyond that of a single heliostat or cluster)

Simulation, over monthly, daily, or sub-hourly effects, and taking in account performance curves of heliostats and receiver modules may give number and locations of heliostats & clusters, by ranking in terms of plant maximum power production or other metrics of interest or in terms of each heliostat and receiver component. During iterations, a point of diminishing returns (e.g. a qualifying cost effectiveness) marks the cutoff in rank for each component's contribution and eventually finalizes the design. Now synthesis of the control system can be implemented to yield, among other things, the static, seasonal, daily, or hourly, etc. alignment data timetable for the receiver and its receiver modules, and where any part of the receiver will be at any given time.

In constructing the solar power generation plant, it may be desirable to plan large or small plant development or expansion phases. With the present invention, it is possible to achieve this by early building and positioning of the receiver's first photovoltaic module or element. It is then possible to commission each heliostat while still commissioning receiver modules. In this manner, it is possible to start populating the heliostat field before the receiver is complete because power is immediately available from the photovoltaic receiver modules and possibly from thermal receiver modules. Delivery and installation of the heliostat field can take time as truckloads arrive and installation crews are finite in size. As long as at least one photovoltaic is operational, heliostats can be aligned. It is, however, easier and faster to establish where a heliostat is pointing if you are watching for its effect on a line of photovoltaics rather than on a single sensing point;

In order to accurately sense and establish the shape of a heliostat reflection from a single photovoltaic, the heliostat will be required to pan a combination of left, up, right, and down movements in order to gauge/verify the reflection size and shape, and hence derive where the heliostat needs to be commanded to point at when the center is actually at the sense point on the receiver module or sensor. Internal heliostat pointing settings to be calibrated typically include parameters such as pulse counts on stepper motors, or quadrature signals, or other actuator position sensor readings or mathematically post-processed quantities.

The first calibration of a heliostat allows the plant to note exactly what values need to be internally achieved by its controller in order to point to a known location near or on the receiver. That starts its historical record in the heliostat field database. The database would have had either no prior data save for a simple estimate or a simulation result. This calibration can be done periodically because all devices and sensors age and deform. When heliostats are aligned and calibrated, they begin contributing to plant power output through the use of any completed photovoltaic modules or harnessed thermal modules.

In this manner, you will typically continue to commission new heliostats and receiver modules while operating the power plant. It is possible to test power production by varying heliostat aim points and paths and observing results. Using the database of simulated data and/or previously collected earlier, each heliostat or cluster is calibration-checked by giving it a path deviation, the simplest, and possibly least expensive of which, may be to simply turn off its motion. The path deviation action also supplies an automatic tuning experiment: If total plant power output increases, the new aim point can be adopted or incorporated into the heliostat (or heliostat cluster's) path, with perhaps no need for further calibration of that heliostat or cluster at this point in time.

One of the reasons for generating different path deviations is that the path shape depends on whether the objective is to test calibration thoroughly, which may occasionally be necessitated, or to explore for increased power generation. Due to simulation, calculation, and/or experimental results (the database taken on commissioning heliostats or later data if available), we expect and watch for a certain sensor set signatures to emerge after a certain amount of time. e.g. 30 seconds. When these readings appear (e.g. a match is found through minimum least squares pattern matching) we correlate it with the expected timing and reflection shape. Early, late, and off-position responses (e.g. 2 photovoltaic cells low) will lead to heliostat recalibration by noting and adopting the new internal values corresponding to the current actual position of its reflection.

To assist the pattern matching and power maximization in a high-noise environment with possibly thousands of heliostats, the MPP controls (i.e. the output regulator/controller associated with one or more receiver modules) can be frozen or otherwise commanded to stop varying their internal parameters. The receiver module sensor/photovoltaic module readings in adjacent areas will then have a potentially major source of relative noise removed, allowing easier discernment of the emergence of the signal pattern of interest caused by the motion of the heliostat reflection of interest. The differential in voltage, current, or power readings between neighboring sensors persists even if other effects such as cloud movement cause drops in solar flux across major areas of the HF and RX.

This allows the system to isolate the aiming location or a heliostat or a group of heliostats from the rest of the heliostats even while all of these heliostats remain in operation. The normally operating heliostats will move according to the movements of the sun to place their reflection on a desired location on the receiver, which may include reflecting the sun onto a particular receiver module or group of receiver modules. These movements are preprogrammed and used to guide the heliostats. As a heliostat or a group of heliostats is moved in a different pattern from the previously programmed pattern (that used for maintaining the sun's reflection on a desired area of the receiver), the position of the sunlight reflected by heliostat(s) onto the receiver will change and the change in position may be detected by the change in output levels from individual receiver modules. Thus, as the heliostat(s) stop movement, or move in a programmed path different from that used to normally follow the sun's movement, the changes in power output in the various receiver modules indicates to a control system where the heliostat(s) are currently aimed. This information may be used to correct the heliostat(s) aiming and may also be used to refine the programmed pattern of movement used to follow the sun and reflect light onto the receiver.

The electrical power controllers which are connected to the receiver modules are typically able to vary the electrical parameters to optimize power production. As an example, these electrical power controllers may continuously vary the output resistance or load in order optimize the voltage or current experienced by a photovoltaic receiver module and most efficiently produce electricity. It is appreciated that causing the electrical power controllers to operate under constant parameters instead of varying parameters will make it easier to detect the changes in electrical output from the receiver modules as the heliostat(s) are moved in a calibration path across a section of the receiver. All electrical power controllers may be held constant during a calibration path movement, or a group of electrical power controllers corresponding to a location on the receiver associated with the calibration path may be held constant during the calibration path.

As an example, if the 'MPP hold mode' takes the form of constant voltage across the section of PV cells that it controls the output of, then one can select current as the sensed parameter of interest, since a change in illumination across those cells will manifest itself rather cleanly as a change in current.

This level of and efficiency in control results in cost savings:

A) Elimination of extra sensing towers. As calibration of the position of a heliostat or group of heliostats may be performed using individual receiver modules as sensors, it is not necessary to have a separate sensing tower to calibrate the heliostats. The use of an extra sensing tower adds to the expense in constructing a solar power generation system and also reduces the output of the system as the heliostats are off of the receiver and not producing electricity while they are being calibrated.

B) Lower production and/or maintenance costs. The present system reduces the wear on the heliostat drive systems as calibration can be performed on the receiver instead of on another sensing tower. The movement of a heliostat from a receiver to a separate sensing tower may involve a large movement of the heliostat. This calibration movement may be as much as one fourth or more of the daily movement of a heliostat. Thus, the extra movement necessitated by calibrating heliostats on a separate sensing tower may cause a correspondingly increased wear on the heliostat drive mechanisms.

The present invention allows for calibration of a heliostat by performing a small calibration path across a section of the receiver. This path is small and does not significantly increase the movement and wear of the heliostat. Where a heliostat is momentarily powered off or held in a constant position for the calibration path (sensing the reflected sunlight drift across receiver modules), no extra movement of the heliostat is required. The heliostat just needs to speed up a bit afterwards in order to get back to a desired operational path again but does not move through a longer overall path. This calibration method results in longer life of the heliostat drive mechanisms and may allow for cheaper materials and manufacturing tolerances in creating these drive systems.

C) The present system uses less reflecting area since each reflection is no longer regularly off-target. In prior art systems, a certain percentage of the heliostats at a given time are off target for calibration. Viewed in another way, all of the heliostats are off target for a certain percentage of their operational time for calibration. The present system does not require moving heliostats off of the receiver and onto a calibration sensor tower. As such, fewer heliostats are required for a given power output and a larger power output is achieved for a given number/size of heliostats.

D) Since the system simulation and control system achieves automatic feedback collection and derivation of actual heliostat pointing offsets, etc., and make use of them to rearrange target points, additional cost savings can result from cheaper drives and electronics inside the heliostats since the motion pointing accuracy, repeatability, and frequency of drift are now less stringent. During installation and commissioning, the heliostats can be set up to work together. For example, if one heliostat cannot point precisely at the center of the receiver, its home position will be assigned elsewhere or its path will involve points that it can achieve.

Another heliostat, elsewhere in the field of potentially thousands of heliostats, can be built to the same specifications, in which case, due to coarseness in its motion drive, it may be able to hit near enough to the RX center, yet not be able to hit where the other one can, due to being in a different field position and orientation. If built to higher precision, or less aged, it can be relied upon to point to the any gap in coverage in any season; and so together they are commanded to achieve something close to the desired flux distribution by sharing the task as calculated by the central controller and implemented through individual calibration corrections, clustering pattern changes, or re-clustering, etc.

E) Reduced power consumption by the heliostats. The calibration of the heliostats through path movements on the receiver itself also reduces the power used by the heliostats. This translates into more energy produced by the system and sold to the customer and allows for cheaper or longer-lasting drive electronics. By way of example, popular in motion drives use stepper motors, which can drive the heliostat drive mechanisms through a given path while being fed different power levels. At higher operational power levels, they are less likely to skip steps. Skipping a step is a typically unnoticed event which is only corrected upon re-calibration.

The present invention achieves this recalibration so easily and quickly (and without power production loss) that calibration can be much more frequent and lost steps become less significant. Thus, it becomes possible to reduce the power consumed by the stepper motors while monitoring and adjusting (managing) their pointing performance and compensating. It is even possible to employ an algorithm which tracks (or records/learns) the skipping patterns each heliostat has and adjusts accordingly such as by commanding the heliostat to move extra steps while in use. The system can track how the tendency to lose steps changes with age, and reduce the frequency of calibration by regularly automatically adjusting the heliostat pointing path by estimated recalibration numbers based on its recorded calibration history. These adjustments may be correlated with weather or special commanded events for that heliostat.

Experiments have already found heliostat drive power reduction figures in excess of 80%. The reduced power consumption of the drive motors reduces heat within the motors and prolongs the motor life. Previously, heliostat drive designs consumed a high amount of power compared to the generated power. One commercial heliostat design consumed an amount of power roughly equivalent to 4.5% of the heliostat's contribution to the power plant output. After implementation of the present control system, the heliostat experienced an 80% reduction in power consumption. Thus, a similarly design prior art power plant with a 100 MW receiver and heliostat array may have consumed 4.5 MW in driving the heliostats for a net power generation of 95.5 MW. The present invention may allow for the heliostat drive power to be reduced to approximately 0.5 MW, allowing for the net power generation to be increased to about 99.5 MW, an increase in approximately 4% of the net output of the plant.

Further reduction in capital costs accrue due to the reduced power consumption of the heliostat operating modes, and the amount of power they draw during peak emergency demand, when they are commanded to move their reflections off of the receiver at significantly higher speeds, assisted by the simulation-assisted technique of calculating shorter emergency pointing paths and identification of only certain heliostats earmarked to draw maximum power first during the emergency. This additional fact that the heliostats can now achieve the typical emergency operation required for safety of people and equipment, using less peak power, and less sustained power during operations, translates into lower power infrastructure costs due to savings in wire thickness/gauge, and hence in kg of copper and its transportation costs, for example.

Figure 14:
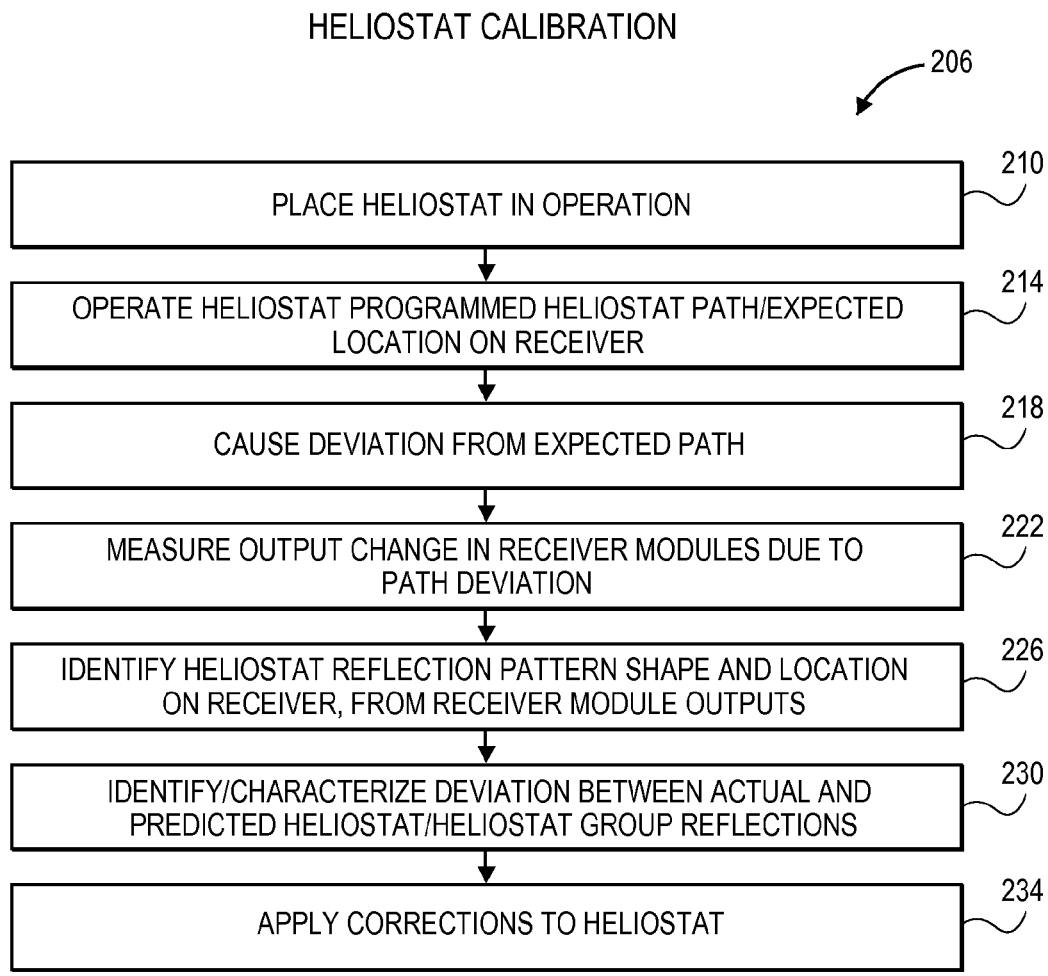
FIG. 14 illustrates a process for calibrating the heliostats.

FIG. 14 illustrates a process 206 which may be used to calibrate a heliostat or group of heliostats and thereby adjust the heliostat aiming or operational path. Initially, the heliostat 14 will be placed in operation 210. The heliostat will typically be operated to track the movement of the sun, placing the heliostat reflection on the receiver 18. The heliostat may be operated to keep the reflection in a single location on the receiver, or may be operated to move the reflection across the receiver. In both cases, the heliostat is operated 214 according to a programmed heliostat path and a corresponding expected location on the receiver 18.

The heliostat 18 is then operated to cause 218 a deviation from the programmed path and expected location on the receiver 18. Depending on the location of the heliostat reflection on the receiver 18, the deviation may involve accelerating the movement of the heliostat, slowing the movement of the heliostat, stopping the heliostat, or moving the heliostat through a another path such as a loop path between particular locations on the receiver. In each case, the heliostat will move differently than the programmed path and the reflected sunlight on the receiver will deviate from its expected location.

The individual receiver modules 46 are then monitored to measure 222 output changes of individual receiver modules and to identify 226 the position of the heliostat on the receiver 18. The individual receiver modules often are connected to a power inverter or other controller. This controller may operate to maximize electricity production, and may thus constantly vary the load across the receiver modules. In order to identify changes in the reflection position of the heliostat, the receiver module controllers in the expected area of the receiver may be operated in a constant mode where their operational parameters are not varied. This allows the changes in sunlight on receiver modules to be more easily observed as changes in voltage, current, etc.

The output from the individual receiver modules is monitored to identify changes in output corresponding to the heliostat reflection movement. This allows the computer control system to identify the location of the heliostat reflection on the receiver. It is appreciated that, if the heliostat is moved through a deviated path, the computer control system may know the shape of the deviated path, and may thus identify the path deviation even if the heliostat was not aimed properly and the path deviation occurs on a different location on the receiver. Identifying the location of the heliostat path deviation (i.e. the movement of the heliostat reflection) on the receiver allows the computer to determine the aiming of the heliostat and to determine 230 if the heliostat is not properly aimed at a desired location on the receiver. The computer system may thus determine the amount by which the heliostat tracking is off from. For larger power generation systems, the receiver 18 may be large enough that the reflection from a heliostat covers only a portion of the receiver surface and the heliostat may thus be aimed at a particular location on the receiver different than the receiver center.

The computer system may then apply 234 a correction to the heliostat in order to keep the heliostat accurately tracking the sun and accurately placing a reflection on the receiver. The correction may be changing the heliostat position to place the heliostat back on a desired path of motion. The correction may also be adjusting the control parameters of the heliostat. For example, if it is determined that the heliostat moves more slowly than expected, due to lost steps, inaccurate motor calibration (i.e. motor steps per degree of movement), etc. the computer may adjust the motor calibration and increase or decrease the motor movement for a desired heliostat movement. In this manner, the calibration methods may accommodate for losses and inaccuracies within the heliostat drive.

Embodiments in accordance with the invention may be embodied as an apparatus, system, device, method, computer program product, or other entities. Accordingly, the invention may take the form of a mechanical structure, an entirely hardware embodiment, an entirely software embodiment (including firmware, resident software, micro-code, etc.), or an embodiment combining mechanical, software and hardware aspects that may all generally be referred to herein as a "module" or "system." Furthermore, the invention may take the form of a computer program product embodied in any tangible medium of expression having computer-usable program code embodied in the medium.

Any combination of one or more computer-usable or computer-readable media may be utilized. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of embodiments described herein may be written in any combination of one or more programming languages, including an object-oriented programming language such as Java, Smalltalk, C++, or the like and conventional procedural programming languages, such as the "C" programming language or similar programming languages. The program code may execute entirely on a computer, partly on a computer, as a stand-alone software package, on a stand-alone hardware unit, partly on a remote computer spaced some distance from, or entirely on a remote computer or server. In the latter scenario, the remote computer may be connected to the power generation system and/or a local computer through any type of network, including a local area network (LAN) or a wide area network (WAN), or the connection may be made to an external computer (e.g., through the Internet using an Internet Service Provider).

Embodiments can also be implemented in cloud computing environments. In this description and the following claims, "cloud computing" is defined as a model for enabling ubiquitous, convenient, on-demand network access to a shared pool of configurable computing resources (e.g., networks, servers, storage, applications, and services) that can be rapidly provisioned via virtualization and released with minimal management effort or service provider interaction, and then scaled accordingly. A cloud model can be composed of various characteristics (e.g., on-demand self-service, broad network access, resource pooling, rapid elasticity, measured service, etc.), service models (e.g., Software as a Service ("SaaS"), Platform as a Service ("PaaS"), Infrastructure as a Service ("IaaS"), and deployment models (e.g., private cloud, community cloud, public cloud, hybrid cloud, etc.).

The embodiments are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams of the Figures illustrate the architecture, functionality, and operation of possible implementations of systems, methods, and computer program products according to one or more embodiments. In this regard, each block in the flowchart or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

It should also be noted that, in some alternative implementations, the functions noted in the blocks may occur out of the order noted in the Figure. In certain embodiments, two blocks shown in succession may, in fact, be executed substantially concurrently, or the blocks may sometimes be executed in the reverse order, depending upon the functionality involved. Alternatively, certain steps or functions may be omitted if not needed.

The invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

The invention claimed is:

1. A method of operating a solar power generation plant, the solar power generation plant having a solar receiver for receiving light and creating power therefrom and having a plurality of heliostats reflecting sunlight at the solar receiver and driven by a drive mechanism to maintain a reflection on the solar receiver as the sun moves, the method comprising:
    operating a heliostat in an operation mode wherein the heliostat follows a predetermined operational path to reflect sunlight at a solar receiver having a plurality of receiver modules arranged in an array while varying operational electrical parameters of the plurality of receiver modules to maximize power generation;
    moving the heliostat in a calibration path whereby the heliostat deviates from the operational path while operating the plurality of receiver modules to maintain constant all but one of output current and output voltage of the plurality of receiver modules;
    monitoring the movement of the heliostat in the calibration path by detecting changes in the at least one of the output current and the output voltage of individual receiver modules; and
    calibrating the heliostat from the detected changes in output of the individual receiver modules.

2. The method of claim 1, wherein the calibration path moves the heliostat away from the predetermined path.

3. The method of claim 1, wherein the calibration path stops the heliostat so that light reflected from the heliostat moves across the receiver due to movement of the sun.

4. The method of claim 1, wherein the calibration path keeps reflected light from the heliostat directed at the receiver.

5. The method of claim 1, wherein monitoring the movement of the heliostat in the calibration path by detecting changes in output of individual receiver modules comprises increases or decreases in output from individual receiver modules as sunlight reflected from the heliostat moves across the receiver.

6. The method of claim 1, wherein monitoring the movement of the heliostat in the calibration path by detecting changes in output of individual receiver modules comprises detecting an increase in voltage or current from a receiver module having a photovoltaic cell.

7. The method of claim 1, wherein calibrating the heliostat from the detected changes in output of the individual receiver modules comprises adjusting the aiming of the heliostat along the predetermined path.

8. The method of claim 1, wherein calibrating the heliostat from the detected changes in output of the individual receiver modules comprises adjusting the transit speed of the heliostat along the predetermined path.

9. The method of claim 1, wherein moving the heliostat in a calibration path comprises moving the heliostat through an alternate operational path.

10. The method of claim 1, wherein the method further comprises operating the heliostat in an operational mode with reduced electrical power and wherein the step of calibrating the heliostat comprises adjusting the transit speed of the heliostat to compensate for inaccuracy associated with reduced electrical power.

11. The method of claim 1, wherein the method comprises using individual receiver modules along the perimeter of the solar receiver to determine if a heliostat has moved away from the center of the solar receiver.

12. The method of claim 9, further comprising determining if power production is higher in the operational path or the alternate operational path.

13. The method of claim 12, wherein the step of calibrating the heliostat comprises operating the heliostat in the operational mode along the alternate operational path.

14. A method of operating a solar power generation plant, the solar power generation plant having a solar receiver for receiving light and creating power therefrom and having a plurality of heliostats reflecting sunlight at the solar receiver and driven by a drive mechanism to maintain a reflection on the solar receiver as the sun moves, the method comprising:
    operating a heliostat in an operation mode wherein the heliostat follows a predetermined operational path to reflect sunlight at a solar receiver having a plurality of receiver modules arranged in an array while varying operational electrical parameters of the plurality of receiver modules to maximize power generation;
    moving the heliostat in a calibration path whereby the heliostat deviates from the operational path while operating individual receiver modules affected by the calibration path with fixed electrical parameters;
    monitoring the movement of the heliostat in the calibration path by detecting changes in output of the individual receiver modules; and
    calibrating the heliostat from the detected changes in output of the individual receiver modules.

15. The method of claim 14, wherein calibrating the heliostat comprises changing the transit speed or aiming of the heliostat.

* * * * *